United States Patent
Khawand

(10) Patent No.: US 8,918,146 B2
(45) Date of Patent: Dec. 23, 2014

(54) AUTOMATIC GAIN CONTROL BASED ON DETECTED PRESSURE

(75) Inventor: Charbel Khawand, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 897 days.

(21) Appl. No.: 12/776,592

(22) Filed: May 10, 2010

(65) Prior Publication Data

US 2011/0275412 A1    Nov. 10, 2011

(51) Int. Cl.
| | | |
|---|---|---|
| *H04M 1/00* | (2006.01) | |
| *H04B 1/38* | (2006.01) | |
| *H04M 1/60* | (2006.01) | |
| *G06F 3/0484* | (2013.01) | |
| *H03G 3/30* | (2006.01) | |
| *H04M 1/66* | (2006.01) | |
| *H04M 1/68* | (2006.01) | |
| *H04M 3/16* | (2006.01) | |
| *H04M 1/725* | (2006.01) | |

(52) U.S. Cl.
CPC ........... *H03G 3/3005* (2013.01); *H04M 1/6016* (2013.01); *H04M 2250/22* (2013.01); *H04M 1/6008* (2013.01); *H04M 1/72563* (2013.01); *G06F 3/04847* (2013.01)
USPC .......................................... 455/566; 455/411

(58) Field of Classification Search
CPC ............................... G06F 3/0488; H04R 1/00
USPC ........ 455/566, 404.2, 410, 411, 414.1, 414.2, 455/456.1, 556.2, 127.2, 177.1, 200.1, 219, 455/232.1, 355
See application file for complete search history.

(56) References Cited

U.S. PATENT DOCUMENTS

| | | |
|---|---|---|
| 6,766,176 B1 | 7/2004 | Gupta et al. |
| 8,390,583 B2 * | 3/2013 | Forutanpour et al. ......... 345/173 |
| 2003/0044028 A1 | 3/2003 | Cranfill et al. |
| 2005/0079896 A1 | 4/2005 | Kokko et al. |
| 2006/0210096 A1 | 9/2006 | Stokes et al. |

(Continued)

OTHER PUBLICATIONS

Vahedian, et al., "Improving Videophone Subjective Quality Using Audio Information", Retrieved at << http://www3.interscience.wiley.com/cgi-bin/fulltext/30000918/pdfstart>>, International Journal of Imaging Systems and Technology, vol. 10, No. 1, 1999, pp. 86-95.

*Primary Examiner* — Eugene Yun
(74) *Attorney, Agent, or Firm* — Bryan Webster; Kate Drakos; Micky Minhas

(57) ABSTRACT

A method and apparatus is provided for adjusting the gain imparted to a signal by an audio transducer such as a microphone and/or a speaker, which is employed by an electronic device having a multi-touch screen user input. The method begins when pressure applied to the multi-touch screen by a user is detected. The pressure is detected while the user is providing or receiving audible signals to or from, respectively, the audio transducer. Next, the user is identified based on a pre-established user profile that identifies the user based on a pressure profile that is obtained by the multi-touch screen. The pressure profile represents at least a contour of a portion the user's head such as the user's ear, cheek or the like. Once the user has been identified, pre-established user-selectable settings associated with the identified user are retrieved from memory. Finally, the gain imparted to the signal by the audio transducer is adjusted upward or downward based at least in part on the detected pressure and in accordance with the user-selectable settings.

20 Claims, 4 Drawing Sheets

(56) References Cited

U.S. PATENT DOCUMENTS

| | | |
|---|---|---|
| 2008/0055163 A1 | 3/2008 | Man et al. |
| 2008/0064336 A1 | 3/2008 | Yoo |
| 2008/0130910 A1 | 6/2008 | Jobling et al. |
| 2008/0153537 A1 | 6/2008 | Khawand et al. |
| 2008/0165022 A1 | 7/2008 | Herz et al. |
| 2008/0180399 A1 | 7/2008 | Cheng |
| 2008/0269926 A1 | 10/2008 | Xiang et al. |
| 2009/0160781 A1 | 6/2009 | Henderson et al. |
| 2009/0256817 A1 | 10/2009 | Perlin et al. |
| 2009/0304191 A1 | 12/2009 | Hoang Co Thuy et al. |
| 2010/0201643 A1* | 8/2010 | Tho et al. ............ 345/173 |
| 2011/0050576 A1* | 3/2011 | Forutanpour et al. ...... 345/168 |

* cited by examiner

AUTOMATIC GAIN CONTROL BASED ON DETECTED PRESSURE

BACKGROUND

Advances in computer and telecommunication technology have led to the wide spread adoption of mobile communication devices. The use of mobile communication devices, and hence the networks forming the communication support infrastructure, has been increasing at a rapid rate in recent years. In many parts of the world, the mobile communication device has become as indispensable as many of the other products we use on a daily basis. Mobile phone users increasingly rely on their mobile devices for their communication and organizational needs.

The fierce competition between mobile phone manufacturers has resulted in many companies providing various different functions to their mobile units in an effort to distinguish their phones from their competitors. Accordingly, mobile phones now often include features that allow them to record and play still images or video, exchange text messages, download audio and video, performs personal digital assistant functions, and so on. Mobile communication devices may operate in accordance with analog or digital signaling protocols. Examples of such protocols which are currently employed by telephone service providers include personal communication service (PCS), code division multiple access (CDMA), and global system of mobile communication (GSM). By utilizing a mobile phone, users are able to communicate with other users of mobile phones, as well with those having fixed-line phones.

While on a voice call, mobile phone users may find the audio gain (i.e., the ratio of output signal power to input signal power) on the speaker as well as the microphone is either too high or too low. For a variety of reasons the gain is not always optimal and the user needs to make volume and positional adjustments in order to improve sound quality and intelligibility. For instance, bandwidth limitations, ambient noise level (noisy environments), size and other limitations of the speaker and microphone contribute to this problem.

SUMMARY

In one implementation, a method and apparatus is provided for adjusting the gain imparted by an audio transducer such as a microphone and/or a speaker, which is employed by an electronic device having a multi-touch screen user input. In this way, the sound quality can be automatically and dynamically improved without user intervention. The method begins when pressure applied to the multi-touch screen by a user is detected. It should be noted that this pressure is applied without the user activating a volume or gain icon available to the user through the multi-touch screen. The pressure is detected while the user is providing or receiving audible signals to or from, respectively, the audio transducer. Next, the user is identified based on a pre-established user profile that identifies the user based on a pressure profile that is obtained by the multi-touch screen. The pressure profile represents at least a contour of a portion of the user's head such as the user's ear, cheek or the like. Once the user has been identified, pre-established user-selectable settings associated with the identified user are retrieved from memory. The user-selectable settings define one or more parameters specifying the manner in which the gain is to be adjusted with changes in the detected pressure. Finally, the gain imparted by the audio transducer is adjusted upward or downward based at least in part on the detected pressure and in accordance with the user-selectable settings.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1:
FIG. 1 shows a mobile phone user cradling a mobile phone while it is in use for placing a call.

Mobile phone users typically speak on a mobile phone by cradling the phone against their ear or cheek so that the portion housing the speaker is adjacent to their ear and the portion housing the microphone extends downward toward their mouth. This method of use is illustrated in FIG. 1. As shown, the front face of the phone is in contact with the user. If the user should have difficulty hearing a remote party through the speaker, the user will have a tendency (consciously or unconsciously) to press the phone closer to his or her ear. Likewise, if a remote party is having difficulty hearing the user through the phone, the user may have a tendency to both speak more loudly and press the phone against his or her cheek in order to speak more directly into the microphone. In either case, the application of increasing pressure on the front face of the mobile phone indicates that the gain of the speaker and/or microphone needs to be increased.

Since more and more mobile phones and other mobile communication devices use a touch screen as their primary user interface device, it is possible to detect the pressure that is exerted upon the face of the mobile phone when it is in use. Accordingly, as detailed below, the gain of the speaker and/or microphone can be increased as the pressure exerted upon the phone's touch screen increases and decreased as the pressure decreases.

Figure 2:
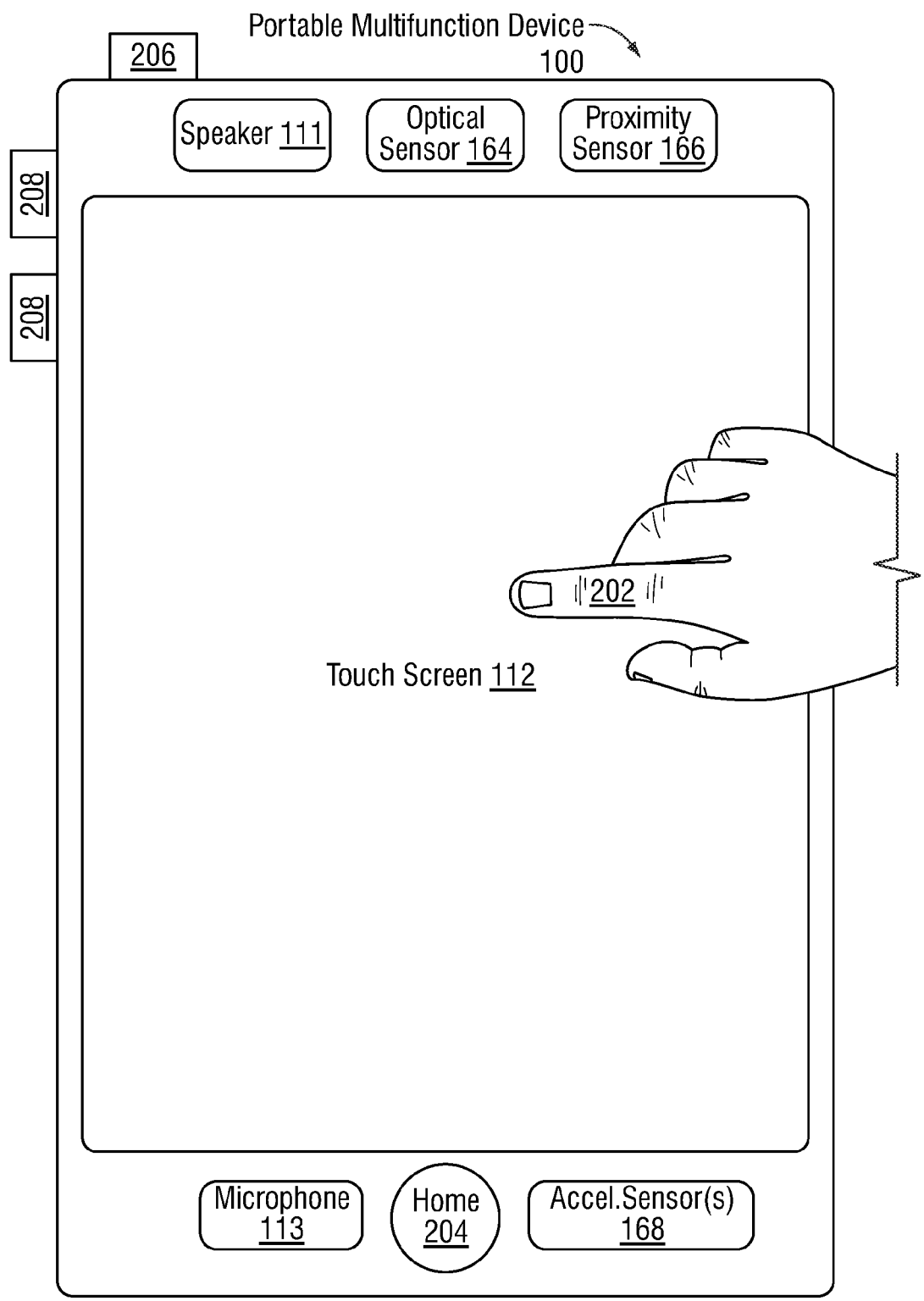
FIG. 2 illustrates one example of a mobile communication device 100 having a multi-touch screen.

FIG. 2 illustrates one example of a mobile communication device 100 having a multi-touch screen. It should be noted that the terms "mobile communication device" and "mobile phone," which are used interchangeably herein, refer to the class of telephone devices equipped to enable a user to make and receive calls wirelessly, notwithstanding the user's movement, as long as the user is within the communication reach of a service or base station of a wireless telephone service network. The terms "mobile communication device" and "mobile phone" are also intended to cover the handset of a cordless phone that communicates over a landline as well as devices that communicate in accordance with a wireless LAN or wireless wide-area LAN standard using, for example, the IEEE 802.11 and 802.16 protocols.

In some examples the device shown in FIG. 2 is a mobile communications device such as a wireless telephone that also contains other functions, such as PDA and/or music player functions. To that end the device may support any of a variety of applications, such as a telephone application, a video conferencing application, an e-mail application, an instant messaging application, a blogging application, a digital camera application, a digital video camera application, a web browsing application, a digital music player application, and/or a digital video player application.

In this example the device 100 includes a multi-touch-sensitive display 112, a menu button 204, a push button 206 for powering the device on/off and locking the device, and volume adjustment button(s) 208. The multi-touch-sensitive display 112 is sometimes called a "multi-touch screen" for convenience, and may also be known as or called a touch-sensitive display system. The push button 206 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In some cases the device 100 also may accept verbal input for activation or deactivation of some functions through the microphone 113. Buttons 204, 206 and 208 may be implemented as physical buttons or soft or virtual buttons or icons that displayed on the multi-touch screen 112.

Multi-touch screen 112 can display and receive information on the same screen. In this way the display can be used as input device instead of, or in addition, to other input devices such as keyboard and mouse. Multi-touch screens are configured to detect two or more simultaneous touching positions at different locations. In this way multiple objects (e.g., fingers) can be tracked on the screen. The multi-touch screen 112 may display one or more graphics or icons. A user may select one or more of the icons by making contact or touching the icons, for example, with one or more fingers 202 (not drawn to scale in the figure). In some embodiments, selection of an icon occurs when the user breaks contact with the icon. In some examples the contact may include a gesture such as one or more taps or swipes.

Figure 3:
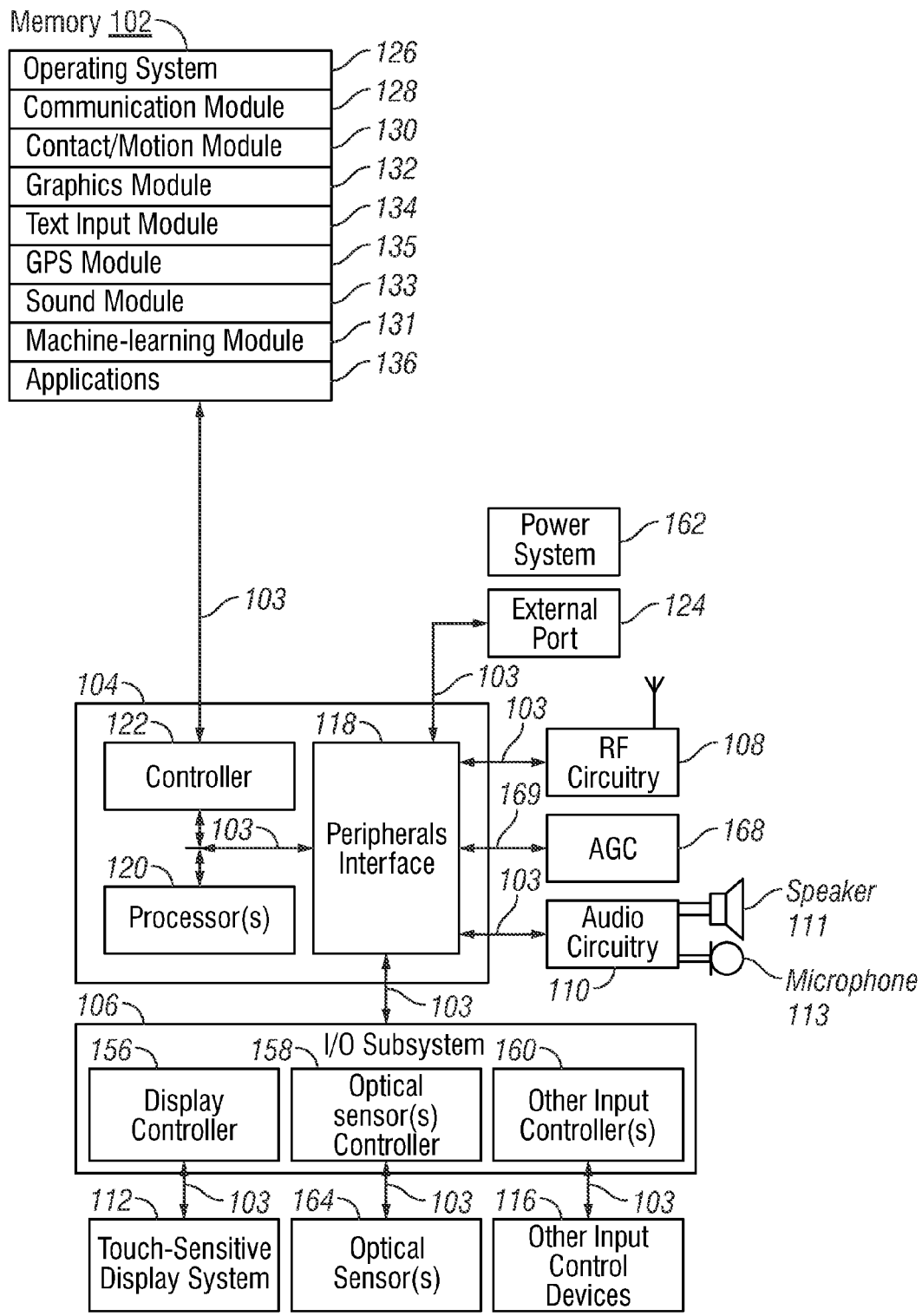
FIG. 3 is a schematic block diagram illustrating one example of a mobile communications device with a multi-touch screen.

FIG. 3 is a schematic block diagram illustrating one example of a mobile communications device 100 with a multi-touch screen 112. The device 100 includes a memory 102 (which may include one or more computer readable storage media), a memory controller 122, one or more processors (CPU's) 120, a peripherals interface 118, RF circuitry 108, audio circuitry 110, a speaker 111, a microphone 113, an input/output (I/O) subsystem 106, other input or control devices 116, and an external port 124. The device 100 may also include one or more optical sensors 164. These components may communicate over one or more communication buses or signal lines 103.

It should be appreciated that the device 100 is only one example of a mobile communications device 100 and that the device 100 may have more or fewer components than shown, may combine two or more components, or a may have a different configuration or arrangement of components. The various components shown in FIG. 2 may be implemented in hardware, software or a combination of both hardware and software, including one or more signal processing and/or application specific integrated circuits.

Memory 102 may include high-speed random access memory and non-volatile memory, such as one or more magnetic disk storage devices, flash memory devices, or other non-volatile solid-state memory devices. Access to memory 102 by other components of the device 100, such as the CPU 120 and the peripherals interface 118, may be controlled by the memory controller 122. The peripherals interface 118 couples the input and output peripherals of the device to the CPU 120 and memory 102. The one or more processors 120 run or execute various software programs and/or sets of instructions stored in memory 102 to perform various functions for the device 100 and to process data. In some examples the peripherals interface 118, the CPU 120, and the memory controller 122 may be implemented on a single chip, such as a chip 104. In other examples they may be implemented on separate chips.

The RF (radio frequency) circuitry 108 includes a receiver and transmitter (e.g., a transceiver) for respectively receiving and sending RF signals, also called electromagnetic signals. The RF circuitry 108 converts electrical signals to/from electromagnetic signals and communicates with communications networks and other communications devices via the electromagnetic signals. The RF circuitry 108 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. The RF circuitry 108 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a plurality of communications standards, protocols and technologies, including but not limited to Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for email, instant messaging, and/or Short Message Service (SMS)), or any other suitable communication protocol, including communication protocols not yet developed as of the filing date of this document.

The audio circuitry 110, the speaker 111, and the microphone 113 provide an audio interface between a user and the device 100. The audio circuitry 110 receives audio data from the peripherals interface 118, converts the audio data to an electrical signal, and transmits the electrical signal to the speaker 111. The speaker 111 converts the electrical signal to human-audible sound waves. The audio circuitry 110 also receives electrical signals converted by the microphone 113 from audible signals (i.e., sound waves). The speaker 111 and microphone 113 are two examples of audio transducers that may be employed in the mobile communications device. The audio circuitry 110 converts the electrical signal to audio data and transmits the audio data to the peripherals interface 118 for processing. Audio data may be retrieved from and/or transmitted to memory 102 and/or the RF circuitry 108 by the peripherals interface 118. In some embodiments, the audio circuitry 110 also includes a headset jack (not shown). The headset jack provides an interface between the audio circuitry 110 and removable audio input/output peripherals, such as output-only headphones or a headset with both output (e.g., a headphone for one or both ears) and input (e.g., a microphone).

The I/O subsystem 106 couples input/output peripherals on the device 100, such as the multi-touch screen 112 and other input/control devices 116, to the peripherals interface 118. The I/O subsystem 106 may include a display controller 156 and one or more input controllers 160 for other input or control devices. The one or more input controllers 160 receive/send electrical signals from/to other input or control devices 116. The other input/control devices 116 may include physical buttons (e.g., push buttons, rocker buttons, etc.), dials, slider switches, joysticks, click wheels, and so forth. In some examples input controller(s) 160 may be coupled to any (or none) of the following: a keyboard, infrared port, USB port, and a pointer device such as a mouse. The one or more buttons (e.g., 208, FIG. 1) may include an up/down button for volume control of the speaker 111 and/or the microphone 113. The one or more buttons may include a push button (e.g., 206, FIG. 1).

The multi-touch screen 112 provides an input interface and an output interface between the device and a user. The display controller 156 receives and/or sends electrical signals from/to the multi-touch screen 112. The multi-touch screen 112 displays visual output to the user. The visual output may include graphics, text, icons, video, and any combination thereof (collectively termed "graphics"). In some cases, some or all of the visual output may correspond to user-interface objects, further details of which are described below.

The multi-touch screen 112 has a touch-sensitive surface, sensor or set of sensors that accepts input from the user based on haptic and/or tactile contact. The multi-touch screen 112 and the display controller 156 (along with any associated modules and/or sets of instructions in memory 102) detect contact (and any movement or breaking of the contact) on the multi-touch screen 112 and converts the detected contact into interaction with user-interface objects (e.g., one or more soft keys, icons, web pages or images) that are displayed on the multi-touch screen.

The multi-touch screen 112 will generally include a suitable display such as an OLED display, PLED display, active matrix liquid crystal display, passive matrix liquid crystal display, electrophoretic display, cholesteric liquid crystal display, polymer dispersed liquid crystal and nematic liquid crystal display. A multi-touch panel extends over the display. The multi-touch panel has a series of transparent sensors that each represents a different coordinate on the screen. The sensors are spaced apart in order to electrically isolate them from each other. The sensors are connected to a sensing controller through a series of thin, flexible, electrical leads that are positioned in the gaps between the spaced apart sensors or between different level of sensors. The sensors, leads and sensing controller are all generally disposed on an optically transmissive member.

In one particular arrangement the multi-touch screen includes a two layer grid of spatially separated lines or wires. The wires on each layer may be parallel to one another. Furthermore, the lines on the different layers are configured to intersect or cross in order to produce a sensor, and each represents different coordinates on the multi-touch screen. The sensors are each configured to detect input from one or more objects touching the screen in their vicinity. The top layer of wires provides the driving lines while the bottom layer provides the sensing lines (or vice verse). The driving lines are connected to a voltage source that separately drives the current through each of the driving lines. They may be driven in a manner similar to a raster scan. The sensing lines are coupled to the sensing controller that continuously senses all of the sensing lines.

When driven, the charge on the driving line to the intersecting sensing lines and the sensing controller senses all of the sensing lines in parallel. Thereafter, the next driving line is driven, and the charge on the next driving line intersecting sensing lines through the sensor and the sensing controller senses all of the sensing lines in parallel. This happens sequentially until all the lines have been driven. Once all the lines have been driven, the sequence starts over and continuously repeats. The sensing controller measures the signal from each line and communicates with the display controller 156. The sensing controller may for example convert the analog signals to digital data and thereafter transmit the digital data over a serial bus to the display controller 156.

In operation, the multi-touch screen begins scanning its surface when it is powered on to detect any pressure that is exerted. Each time it performs a scan, it will measure the pressure at all points on its surface, interpret the data, and send it to the display controller 156.

The multi-touch screen may employ sensors based on any of a wide variety of technology platforms. For instance, capacitive array, compressible capacitive array, optical, resistive array, and strain gauge technologies may be employed.

Capacitive array sensors detect changes in capacitance due to the proximity of a conductor such as metal or a part of the human body (body capacitance). A compressible capacitive array employs a compressible material that is placed between column and row electrodes. As pressure is applied, the material compresses increasing the capacitive coupling of an AC signal between row and column electrodes. Optical sensor technologies employ a light diffusing material that is placed over a rigid transparent surface. The diffused light is then picked up by a camera located behind the surface. Resistive surface sensors have an array of cells formed from a force sensitive resistance (FSR) material, which are arranged in a grid pattern.

The device 100 also includes a power system 162 for powering the various components. The power system 162 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

The device 100 may also include one or more optical sensors 164. FIG. 2 shows an optical sensor coupled to an optical sensor controller 158 in I/O subsystem 106. The optical sensor 164 may include charge-coupled device (CCD) or complementary metal-oxide semiconductor (CMOS) phototransistors. The optical sensor 164 receives light from the environment, projected through one or more lens, and converts the light to data representing an image. In conjunction with an imaging module 143 (also called a camera module), the optical sensor 164 may capture still images or video.

In some embodiments, the software components stored in memory 102 may include an operating system 126, a communication module (or set of instructions) 128, a contact/motion module (or set of instructions) 130, a graphics module (or set of instructions) 132, a text input module (or set of instructions) 134, a Global Positioning System (GPS) module (or set of instructions) 135, a sound module 133 (or set of instructions), a machine learning module 131 and applications (or set of instructions) 136.

The operating system 126 (e.g., Darwin, RTXC, LINUX, UNIX, OS X, Microsoft WINDOWS®, Android or an embedded operating system such as VxWorks) includes various software components and/or drivers for controlling and managing general system tasks (e.g., memory management, storage device control, power management, etc.) and facilitates communication between various hardware and software components. The communication module 128 facilitates communication with other devices over one or more external ports 124 and also includes various software components for handling data received by the RF circuitry 108 and/or the external port 124 (e.g., Universal Serial Bus (USB), FIREWIRE, etc.).

The contact/motion module 130 may detect contact with the multi-touch screen 112 (in conjunction with the display controller 156) and other touch sensitive devices (e.g., a touchpad or click wheel). The contact/motion module 130 includes various software components for performing various operations related to detection of contact, such as determining if contact has occurred, determining if there is movement of the contact and tracking the movement across the touch screen 112, and determining if the contact has been broken (i.e., if the contact has ceased). Determining movement of the point of contact may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g. multiple finger contacts).

The graphics module 132 includes various known software components for rendering and displaying graphics on the multi-touch screen 112, including components for changing the intensity of graphics that are displayed. As used herein, the term "graphics" includes any object that can be displayed to a user, including without limitation text, web pages, icons (such as user-interface objects including soft keys), digital images, videos, animations and the like. The text input module 134, which may be a component of graphics module 132, provides soft keyboards for entering text in various applications (e.g., contacts 137, e-mail 140, IM 141, blogging 142, browser 147, and any other application that needs text input).

The GPS module 135 determines the location of the device and provides this information for use in various applications (e.g., applications that provide location-based services such as weather widgets, local yellow page widgets, and map/navigation widgets).

The applications 136 may include any combination of the following modules: a contacts module, a telephone module; a video conferencing module; an e-mail client module an instant messaging (IM) module; a blogging module; a camera module; an image management module; a video player module; a music player module; a browser module; a word processing module; a voice recognition module; a calendar module; widget modules, which may include a weather widget, stocks widget, calculator widget, alarm clock widget, dictionary widget, and other widgets obtained by the user, as well as user-created widgets.

Each of the above identified modules and applications correspond to a set of instructions for performing one or more functions described above. These modules (i.e., sets of instructions) need not be implemented as separate software programs, procedures or modules, and thus various subsets of these modules may be combined or otherwise re-arranged in various embodiments. In some embodiments, memory 102 may store a subset of the modules and data structures identified above. Furthermore, memory 102 may store additional modules and data structures not described above.

As previously mentioned, in order to maintain a proper volume level for the mobile communication device's audio transducer(s) (i.e, speaker and/or microphone), the gain of the audio transducer(s) can be increased as the pressure exerted upon the phone's touch screen increases and decreased as the pressure decreases. For this purpose the device 100 includes automatic gain control (AGC) circuitry 168, which is responsive to pressure exerted on the multi-touch screen 112 and generates one or more signals that are communicated to the audio circuitry 110. The AGC circuitry 168 may receive a map of multiple pressure points exerted upon the touch screen 112. Based on this information the AGC circuitry 168 can determine the adjustment that is necessary to the speaker gain and the microphone gain.

The pressure map represents values of pressure at the (x,y) coordinates where the user's head exerts pressure on the touch screen. The AGC circuitry 168 relates this representation to a particular gain adjustment of the speaker and/or microphone. The relationship between the pressure map and the gain adjustment may be predefined and stored in a database or the like so that it may be accessed by the AGC circuitry 168. For instance, if the user's ear is sensed below the location of the speaker, the gain may be increased by a predetermined amount to compensate for the distance between the speaker and the ear. Moreover, in some cases the relationship between the pressure map and the manner in which the gain is varied may be user-adjustable. Gain adjustments may be based on various information that the AGC circuitry 168 derives from the pressure map. Such information may include, for example, the pressure magnitude and/or changes thereto as well as the pressure pattern (or changes thereto) arising from the multiple pressure points. For example, if the user adjusts the position of the phone so that the microphone is closer to his or her mouth, this positional adjustment may be reflected in changes to the pressure pattern applied to the multi-touch screen, which in turn may cause the gain imparted by the microphone to be increased.

In some implementations the speaker and microphone gain can be adjusted in unison with one another. For example, if the user's ear is sensed below the location of the speaker, the speaker gain may be increased (as discussed above) and the microphone gain may be decreased since the user's mouth is now presumably closer to the microphone, thus requiring less gain. In other implementations the speaker and microphone gains may be independently adjusted based on the distribution of pressure points on the multi-touch screen 112. For instance, if the pressure exerted on the multi-touch screen 112 increases more in the vicinity of the speaker, only its gain may be increased or, alternatively, increased more than the gain of the microphone. Likewise, if the pressure exerted on the multi-touch screen 112 increases more in the vicinity of the microphone, only its gain may be increased or, alternatively, increased more than the gain of the speaker.

In some implementations a machine learning module 131 may implement a machine learning process during an initialization period for a particular user. Any of a wide variety of machine-learning algorithms may be employed by module 131. Examples of such algorithms are shown, for instance, in Mitchell, Tom M., "Machine Learning", McGraw-Hill, 1997. During this period the pressure distribution may be measured while the phone is in use in a variety of different environments. In this way an average distribution of pressure can be measured over a period of time and/or in a number of different environments (e.g., a quiet environment and a noisy environment). Deviations from this average pressure distribution can be used to determine the appropriate adjustments that should be made to the gain levels. Of course, a wide variety of different algorithms, ranging from the simple to the complex, may be used to determine the precise relationship between the gain level applied to each transducer (i.e., the speaker and microphone) and the pressure distribution map. The sophistication of the algorithm that is employed may depend in part on the processing power that is available in the mobile communication device 100.

As an example, one algorithm may use the coordinates of the actual pressure points in the pressure map along with the anticipated coordinate points of the user's ear on the touch screen and apply them to a digital signaling filter, which transforms them to an output gain value. The anticipated coordinate points may be default coordinate points that are stored in memory and may or may not be user-adjustable. The digital signaling filter may also filter out noise such as small changes in the ear's location as reflected by the pressure map. In this way the user can make small adjustments to the mobile communication device's position or orientation against the user's ear without causing changes to the gain. In an alternative implementation, the algorithm may be a predictive algorithm that anticipates movement of the user's ear by taking into account various parametric values such as the ambient noise level and the nature (e.g., frequency distribution) of the voice being rendered by the speaker, for instance. The algorithm then adjusts the gain based on these parametric values. The sound module 133 may include user-selectable settings that allow the user to select values for various parameters associated with the automatic gain control process. For instance, the user may be able to turn automatic gain control on and off for the speaker, microphone or both the speaker and microphone, place limits on the degree to which the gain can be adjusted, enter a learning mode of operation, adjust the sensitivity of the multi-touch screen and so on. Default values may be established for each pertinent parameter unless overridden by the user. In some cases the learning mode of operation may be used to establish a user's individual pressure profile on the touch screen. In this way the mobile communication device can automatically identify different users and automatically apply the settings that are associated with them.

While the above discussion has focused on the transducer gain adjustments that are made in response to pressure changes, other types of adjustments may be made instead of or in addition to gain adjustments. For example, instead of simply adjusting overall gain, the equalization profile of the speaker and/or microphone may be adjusted. For example, in some cases it may be desirable to increase the gain of the lower or base frequencies more than higher frequencies (or vice versa). That is, the gain may be adjusted in a frequency dependent manner to adjust the equalization profile of the transducer.

The process of adjusting transducer gain in response to multi-touch screen pressure changes can be applied to devices other than the mobile communication devices discussed above. In particular, this process may be used in connection with any touch-screen equipped devices having a transducer gain that can be adjusted in response to pressure that is exerted upon them by a portions of the user's body. Examples of such devices may include dictating and other recording devices and headphones (if suitably equipped with a touch-screen).

Figure 4:
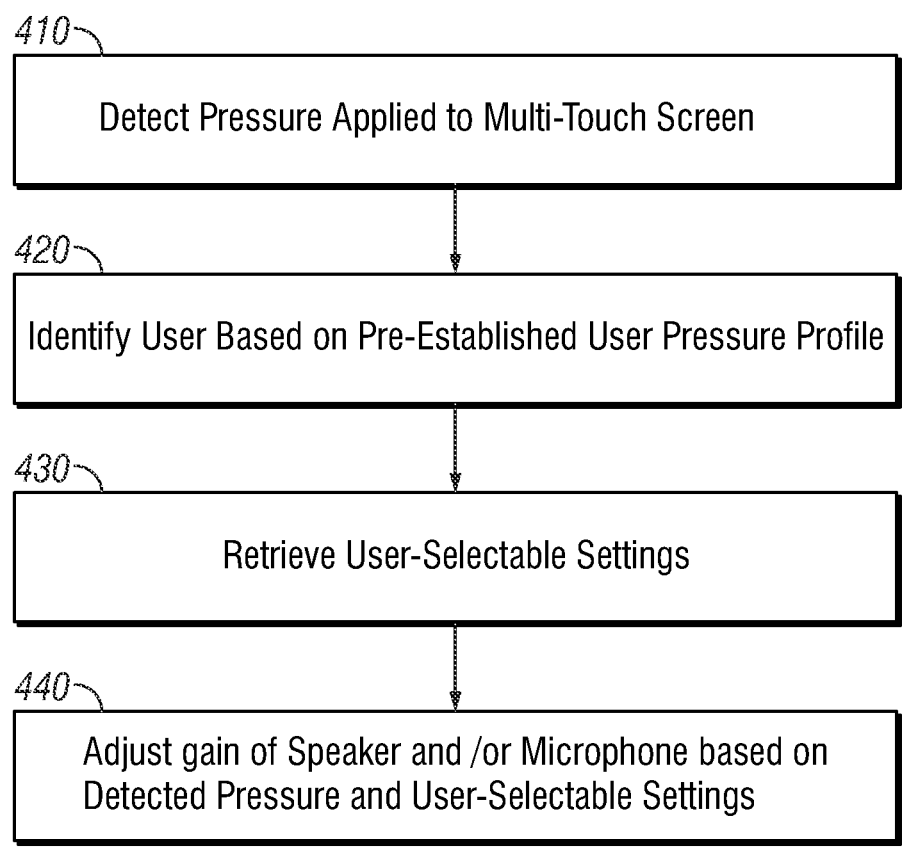
FIG. 4 is a flowchart showing one example of a method for adjusting the gain imparted by an audio transducer such as a microphone and/or a speaker, which is employed by an electronic device having a multi-touch screen user input.

FIG. 4 is a flowchart showing one example of a method for adjusting the gain imparted by an audio transducer such as a microphone and/or a speaker, which is employed by an electronic device having a multi-touch screen user input. The method begins in step 410 when pressure applied to the multi-touch screen by a user is detected. It should be noted that this pressure is applied without the user activating a volume or gain icon available to the user through the multi-touch screen. The pressure is detected while the user is providing or receiving audible signals to or from, respectively, the audio transducer. Next, in step 420, the user is identified based on a pre-established user profile that identifies the user based on a pressure profile that is obtained by the multi-touch screen. The pressure profile represents at least a contour of a portion the user's head such as the user's ear, cheek or the like. Once the user has been identified, pre-established user-selectable settings associated with the identified user are retrieved from memory in step 430. The user-selectable settings define one or more parameters specifying the manner in which the gain is to be adjusted with changes in the detected pressure. Finally, in step 440, the gain imparted by the audio transducer is adjusted upward or downward based at least in part on the detected pressure and in accordance with the user-selectable settings.

As used in this application, the terms "component," "module," "engine," "system," "apparatus," "interface," or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. For instance, the claimed subject matter may be implemented as a computer-readable medium embedded with a computer executable program, which encompasses a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD). . . ), smart cards, and flash memory devices (e.g., card, stick, key drive . . . ). Of course, those skilled in the art will recognize many modifications may be made to this configuration without departing from the scope or spirit of the claimed subject matter.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method, comprising:
   detecting one or more points of pressure applied to a multi-touch screen of an electronic device by a user to generate a pressure profile;
   comparing the pressure profile to one or more pre-established user profiles to determine an identity of the user;
   retrieving a set of one or more pre-established user-selectable settings associated with the identity of the user; and
   configuring one or more settings of the electronic device based upon the set of one or more pre-established user-selectable settings.

2. The method of claim 1, the one or more settings comprising audio settings.

3. The method of claim 1, comprising:
   developing a pressure map based upon the one or more points of pressure; and
   adjusting the one or more settings based upon the pressure map.

4. The method of claim 1, the one or more settings comprising a gain of a speaker of the electronic device.

5. The method of claim 1, the one or more settings comprising a gain of a microphone of the electronic device.

6. The method of claim 1, comprising:
sensing a degree of pressure applied to the multi-touch screen by the user; and
adjusting the one or more or more settings based upon the degree of pressure.

7. The method of claim 1, at least some of the one or more points of pressure applied by a head of the user.

8. The method of claim 1, the pressure profile corresponding to a profile of an ear of the user.

9. The method of claim 1, the one or more settings comprising a setting of an audio transducer, the audio transducer corresponding to at least one of a speaker or a microphone.

10. The method of claim 1, the electronic device comprising a mobile communication device.

11. A mobile communications device, comprising:
a multi-touch screen configured to detect one or more points of pressure applied to the multi-touch screen by a user to generate a pressure profile;
and
a processor configured to:
compare the pressure profile to one or more pre-established user profiles to determine an identity of the user;
retrieve a set of one or more pre-established user-selectable settings associated with the identity of the user; and
configure one or more settings of the mobile communications device based upon the set of one or more pre-established user-selectable settings.

12. The mobile communications device of claim 11, the one or, more settings comprising audio settings.

13. The mobile communications device of claim 11, the one or more settings comprising a gain of at least one of a speaker or a microphone.

14. The mobile communications device of claim 11, the processor configured to:
develop a pressure map based upon the one or more points of pressure; and
adjust the one or more settings based upon the pressure map.

15. The mobile communications device of claim 11, comprising:
memory configured to store a plurality of sets of one or more pre-established user-selectable settings, a first set corresponding to a first user and a second set corresponding to a second user.

16. The mobile communications device of claim 11, the processor configured to:
sense a degree of pressure applied to the multi-touch screen by the user; and
adjust the one or more or more settings based upon the degree of pressure.

17. The mobile communications device of claim 11, the pressure profile corresponding to a profile of an ear of the user.

18. A computer-readable medium, not comprising a propagated data signal, embedded with a computer executable program including instructions executable by a computing system, the instructions configuring the computing system to perform a method, comprising:
detecting one or more points of pressure applied to a multi-touch screen of an electronic device by a user to generate a pressure profile;
comparing the pressure profile to one or more pre-established user profiles to determine an identity of the user;
retrieving a set of one or more pre-established user-selectable settings associated with the identity of the user; and
configuring one or more settings of the electronic device based upon the set of one or more pre-established user-selectable settings.

19. The computer-readable medium of claim 18, the method comprising:
sensing a degree of pressure applied to the multi-touch screen by the user; and
adjusting the one or more or more settings based upon the degree of pressure.

20. The computer-readable medium of claim 18, the method comprising
developing a pressure map based upon the one or more points of pressure; and
adjusting the one or more settings based upon the pressure map.

* * * * *